United States Patent
Wang

(10) Patent No.: US 6,461,801 B1
(45) Date of Patent: Oct. 8, 2002

(54) RAPID HEATING AND COOLING OF WORKPIECE CHUCKS

(75) Inventor: Albert Wang, Moraga, CA (US)

(73) Assignee: Matrix Integrated Systems, Inc., Richmond, CA (US)

( * ) Notice: Subject to any disclaimer, the term of this patent is extended or adjusted under 35 U.S.C. 154(b) by 0 days.

(21) Appl. No.: 09/579,943

(22) Filed: May 26, 2000

Related U.S. Application Data

(60) Provisional application No. 60/136,738, filed on May 27, 1999.

(51) Int. Cl.[7] ............................. G03F 7/42; F25B 29/00
(52) U.S. Cl. ......................... 430/329; 430/330; 165/61
(58) Field of Search .................... 430/329, 330; 165/61

(56) References Cited

U.S. PATENT DOCUMENTS

| | | | | |
|---|---|---|---|---|
| 4,628,991 A | * | 12/1986 | Hsiao et al. | 165/80.4 |
| 4,717,645 A | | 1/1988 | Kato et al. | 430/296 |
| 4,811,493 A | | 3/1989 | Burgio, Jr. | 34/4 |
| 4,863,547 A | | 9/1989 | Shidahara et al. | 156/345 |
| 4,949,783 A | | 8/1990 | Lakios et al. | 165/80.1 |
| 5,033,407 A | | 7/1991 | Mizuno et al. | 118/725 |
| 5,181,556 A | | 1/1993 | Hughes | 165/80.1 |
| H1145 H | * | 3/1993 | Anderson | 165/61 |
| 5,248,370 A | | 9/1993 | Tsui et al. | 156/345 |
| 5,259,883 A | | 11/1993 | Yamabe et al. | 118/725 |
| 5,318,801 A | | 6/1994 | Snail et al. | 427/248.1 |
| 5,372,648 A | | 12/1994 | Yamamoto et al. | 118/723 E |
| 5,443,997 A | | 8/1995 | Tsui et al. | 437/225 |
| 5,447,431 A | | 9/1995 | Muka | 432/4 |
| 5,520,538 A | | 5/1996 | Muka | 432/205 |
| 5,520,742 A | | 5/1996 | Ohkase | 118/724 |
| 5,778,968 A | | 7/1998 | Hendrickson et al. | 165/80.1 |
| 5,883,778 A | * | 3/1999 | Sherstinsky et al. | 361/234 |
| 5,937,541 A | | 8/1999 | Weigand et al. | 34/92 |
| 5,970,717 A | | 10/1999 | Tateyama | 62/3.2 |

FOREIGN PATENT DOCUMENTS

| | | |
|---|---|---|
| JP | 62 282 437 | 12/1987 |
| JP | 03 224 236 | 10/1991 |
| JP | 04 176 121 | 6/1992 |
| JP | 07 045 536 | 2/1995 |
| WO | WO 93/26038 | 12/1993 |
| WO | WO 94/14185 | 6/1994 |

* cited by examiner

Primary Examiner—Richard L. Schilling
(74) Attorney, Agent, or Firm—Knobbe, Martens, Olson & Bear, LLP.

(57) ABSTRACT

A workpiece support or chuck that rapidly heats and cools a semiconductor workpiece is disclosed. A heat source and a cooling source, maintained at different temperatures, alternately communicate with the chuck. In one embodiment, the heat source and cooling source alternately provide relatively "hot" and "cold" heat transfer fluids to fluid channels within the workpiece chuck. Accordingly, a semiconductor workpiece in contact with the chuck rapidly heats to the temperature of the hot fluid, or rapidly cools to the temperature of the cold fluid, depending upon which fluid flowing through the chuck. In another embodiment, the heat source comprises a movable resistive heating block at a first temperature that is placed in contact with the chuck during heating, and is removed from the chuck while colder heat transfer fluid circulates within the chuck. Optionally, inert fluid can be provided to purge heat transfer fluid from the chuck channels between heating and cooling steps.

17 Claims, 2 Drawing Sheets

RAPID HEATING AND COOLING OF WORKPIECE CHUCKS

REFERENCE TO RELATED APPLICATION

The present application claims the priority benefit under 35 U.S.C. §119(e) from provisional application No. 60/136,738, of Wang, filed May 27, 1999.

FIELD OF THE INVENTION

The present invention relates generally to temperature control of workpiece supports for semiconductor processing equipment, and more particularly to rapid heating and cooling of such chucks for resist stripping chambers.

BACKGROUND OF THE INVENTION

In many semiconductor processing steps, such as etching, deposition, annealing, etc., a workpiece (e.g., a silicon wafer, glass substrate, etc.) is supported within a processing chamber. Gaseous and/or plasma reactants are supplied to the surface of the workpiece while the workpiece is heated to specific temperatures.

Typically, higher temperatures aid in achieving higher reaction rates, and therefore higher workpiece throughput. On the other hand, high temperatures can sometimes cause damage to structures on partially fabricated integrated circuits. Additionally, certain chemical reactions are most efficiently performed at lower temperatures.

Many structures and methods are known in the art for controlling workpiece temperature within the chamber. For example, radiant heat may be supplied to the workpiece through transparent "cold walls" formed of quartz. Radiant heat is particularly used for very high temperature processing (e.g., at greater than 500° C.), where it is desirable to raise and lower temperature during the process cycle for each workpiece.

In other arrangements, the temperature of the workpiece support, particularly gravitational, electrostatic or vacuum wafer chucks, can be regulated by resistive heating. Conventionally, "chucks" refer to supports for processing workpieces that are kept at constant temperature as workpieces transferred in, processed and transferred out in cycles. Some systems, particularly plasma processing systems, require cooling rather than heating in order to maintain the desired chuck temperature constant.

Regardless of the particular method used to heat the workpiece, workpieces must often be cooled down after processing is completed. For example, a processed workpiece is advantageously allowed to cool to less than about 70° C. prior to placement in a low cost storage cassette that would otherwise melt. Since processing time within the chamber is at a premium, such cooling is most typically performed outside of the chamber on a separate station, such that another workpiece can be introduced to the process chamber while the first workpiece is cooling. Workpiece temperature ramping is thereby minimized, as the massive chuck is maintained at a substantially constant temperature while multiple workpieces are sequentially processed.

While a number of heating and cooling systems are known in the art, many of these systems are generally overly complex, too slow, susceptible to particulate generation within the chamber, etc. Accordingly, a need exists for an improved method and apparatus for controlling the temperature of workpiece supports.

SUMMARY OF THE INVENTION

In satisfaction of this need, a chuck for supporting a workpiece within a semiconductor processing chamber. The chuck is provided with temperature control mechanisms that permit rapid heating or cooling of the chuck during processing.

In accordance with one aspect of the invention, an apparatus is provided for controlling the temperature of workpieces in a semiconductor processing reactor. The apparatus includes a support with fluid channels. A cold fluid source communicates with the fluid channels via a first supply line, and is configured to maintain a cold fluid maintained at a first temperature. A heat source is maintained at a second temperature, which is higher than the first temperature. A mechanism is provided for conductively transferring heat from the heat source to the support.

In accordance with another aspect of the invention, a method is provided for controlling a workpiece chuck temperature in a process chamber. A first heat transfer fluid circulates through the chuck during a cold phase to bring the chuck to a first temperature. The first heat transfer fluid is removed from the chuck during a hot phase. Also in the hot phase, the chuck is heated to a second temperature higher than the first temperature.

In one embodiment, both a high temperature fluid source and a low temperature fluid source are connected to the fluid channels. By switching between circulation of the high temperature fluid and low temperature fluid, the wafer chuck and thus the workpiece on it, can be rapidly heated or cooled between two different temperatures. In another embodiment, a relatively low temperature fluid is supplied to the fluid channels in the wafer chuck during at least a portion of each cycle. When high temperatures are desired, a heater block is in close contact with the chuck. When low temperatures are desired, the heater block is physically moved from contact with the chuck and lower temperature heat transfer fluid flows through the chuck.

Advantageously, the dual temperature chucks of the preferred embodiments can be used in a photoresist-stripping reactor. In one process, cool fluid is utilized to rapidly reduce workpiece temperature before removing the workpiece from the chuck. In another embodiment, low temperature fluid is kept at a temperature appropriate for a cleaning process, while a high temperature fluid supply or a heater block is kept at a high temperature suitable for photoresist stripping. Similarly, other multiple-step processes, particularly including photoresist stripping, can be conducted at different temperatures rapidly and efficiently using the same wafer chuck.

BRIEF DESCRIPTION OF THE DRAWINGS

These and other aspects of the invention will be readily apparent from the description below and from the appended drawings, in which.

DETAILED DESCRIPTION OF THE PREFERRED EMBODIMENT

While the invention is described in the context of microwave downstream plasma systems, the skilled artisan will readily find application for the principles disclosed herein in a variety of contexts. The processes and structures disclosed herein have particular utility where workpiece chucks desirably support rapid cooling and heating features. For example, it is advantageous for resist stripping reactors to undergo two-step processes at different temperatures.

Preferred Dual Temperature Chucks.

Figure 1:
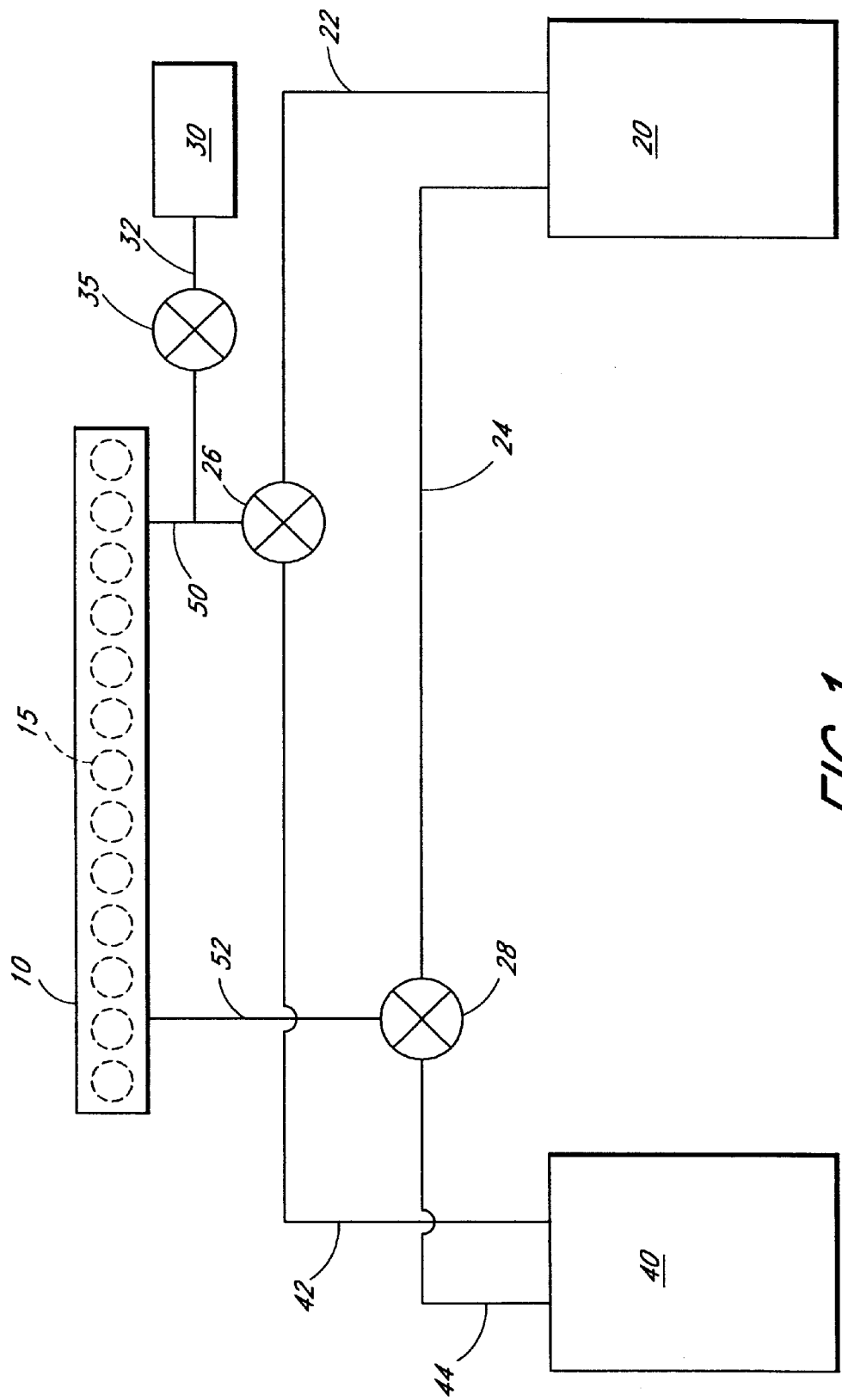
FIG. 1 is a schematic view of a dual temperature workpiece chuck having a cold fluid source and a hot fluid source, constructed in accordance with a first preferred embodiment of the present invention.

Referring first to FIG. 1, a workpiece support apparatus or wafer chuck 50 is provided with fluid flow channels 15. It will be understood that the channels can be connected in series to define a single flow path winding through the chuck. Preferably, to speed up the temperature response of the wafer chuck 10, its thermal capacity is preferably minimized. Accordingly, the fluid channels 15 preferably occupy at least about 50% of the wafer chuck volume, more preferably at least about 70%.

The skilled artisan will readily appreciate that the fluid channels 15 can be provided in the wafer chuck 10 in a variety of manners. The fluid channels 15 can be machined into a metal block from which the chuck 10 is formed, or the channels 15 can be formed in a molding process. In other arrangements, the chuck 10 can be formed of two pieces, with machined surface channels (not shown) in one piece covered by the other piece. For example, surface channels can be formed in a lower piece, with mating surface channels in the upper piece.

The chuck 10 can have any suitable construction, and in the illustrated embodiment provides an electrostatic attractive force for holding a workpiece (not shown) in place. In other arrangements, the chuck 10 can include vacuum channels for holding the workpiece to the chuck 10. In still other arrangements, a workpiece is held solely by gravitational forces on a susceptor or other support means. The body of the chuck 10 is desirably formed of a thermally conductive material, and in the illustrated embodiment is formed of aluminum alloy.

A reactor (not shown) of the preferred embodiment includes mechanisms for maintaining the chuck 10 at two different temperatures at different stages or phases of a process cycle. Desirably, the mechanisms of the reactor are configured to rapidly exchange heat with the chuck 10, effectively raising or lowering its temperature. Advantageously, the chuck/workpiece combination rapidly reaches and maintains a desirable high or low temperature.

In the illustrated embodiment of FIG. 1, a high temperature mechanism or heat source comprises a hot fluid source 20 that is connected to the fluid channels 15 within the wafer chuck 10 by way of a supply line 22 and a return line 24. A switch to bring the heat source into thermal communication with the chuck 10 includes switching valves 26 and 28 along each of the supply 22 and return lines 24, desirably centrally controlled to switch between the hot fluid source 20 and a cold fluid source 40 that will be discussed in more detail below. While not illustrated, it will be understood that the system includes pumping means for circulating fluid through the wafer chuck 10.

Optionally, purge source 30 is connected to the supply line 22 between the hot fluid source and the wafer chuck 10. Desirably, a purge line 32 supplies a non-reactive or inert gas from the purge source 30 to the supply line 22 by way of a two-way valve or purge valve 35, which is advantageously also centrally controlled. The illustrated purge gas is nitrogen ($N_2$). Other suitable purge gases include argon (Ar), helium (He), hydrogen ($H_2$), and other gases which are non-reactive with the heat transfer fluid and with the material of the wafer chuck 10. It will be understood that a liquid can also be used for purging, though that is less preferred.

The hot fluid source 20 desirably holds a heat transfer fluid, the composition of which may vary with the application. The boiling point of the heat transfer fluid is preferably greater than about 200° C., more preferably greater than about 250° C. Preferred examples include a fluid commercially available under the trade name Paratherm NF™ from Paratherm Corporation of Conshohocken, Pa. Another suitable thermal transfer fluid comprises Dowtherm™, commercially available from the Dow Chemical Company of Midland, Mo. These fluids operate efficiently for heat transfer at temperatures up to about 400° C. On the other hand, Galden-HT270 from the Kurt J. Lesker Company of Clairton, Pa., is preferably used for electrostatic chucks due to its superior dielectric properties. It can be operated at temperatures of up to about 270° C.

As is further illustrated in the preferred embodiment of FIG. 1, a cold source comprises a cold fluid source 40 that is also connected to the fluid channels 15 within the wafer chuck 10 via a supply line 42 and a return lines 44. It should be generally understood that the term "cold" refers only to the temperature of the cold fluid source 40 relative to the temperature of the hot fluid source 20. For example, in preferred embodiments disclosed below, the actual "cold" fluid source 40 is heated to a temperature above room temperature.

In the illustrated embodiment, the cold fluid source 40 is connected to the same fluid channels 15 in the wafer chuck 10 as the hot fluid source 20, thus maximizing the thermal mass of either the hot or cold heat transfer fluid, depending upon the point in the cycle, that can be flowed through the chuck 10. As with the hot fluid source 20, the cold fluid source 40 includes switchable valves 26, 28 on each of the return line 44 and the supply line 42. In the illustrated embodiment, the valves comprise the same three-way switching valves 26, 28 that also connect to the supply and return lines 22, 24 of the hot fluid source 20. Thus, the supply and return lines 22, 24, 42, 44 for the hot and cold fluid sources 20, 40 include common sections (common supply line section 50 and common return line section 52) between the three-way switching valves 26, 28 and the wafer chuck 10. Thus, as used herein, the supply lines 22, 42 each include the common supply line section 50 and the return lines 24, 44 each include the common return line section 52.

Advantageously, the heat transfer fluid within the cold fluid source 40 comprises the same type of fluid held in the hot fluid source 20, thus avoiding problems of cross-contamination and reaction between the fluids. Preferably, the cold fluid is maintained at temperatures less than about 150° C., and for certain embodiments more preferably less than 100° C. or less than 50° C., depending upon the purpose of the cold fluid source 40. For example, where the cold fluid source 40 serves to cool the workpiece prior to transferring the wafer to a cassette, the cold fluid is preferably kept at a temperature range less than about 100° C., and more preferably less than about 70° C. On the other hand, where the cold fluid source 40 serves to maintain the workpiece temperature during one or more relatively low temperature steps during a multi-step process, the cold fluid is preferably maintained at or slightly above the desirable workpiece temperature.

Fluid temperature in each of the hot fluid source 20 and the cold fluid source 40 can be maintained at their respective desirable temperatures by any of a variety of suitable heating or cooling means, as will be readily understood by one of ordinary skill in the art. In the illustrated embodiments, both the hot and cold fluid sources 20, 40 are heated above room temperature. However, where the cold fluid source 40 serves only to lower workpiece temperature prior to transfer to a storage cassette, the cold fluid can be maintained below room temperature. The skilled artisan can readily determine, for a particular wafer chuck 10 configuration, the appropriate temperature at which to keep the heat transfer fluid in order for the workpiece to be kept at the desired temperature. Factors affecting a temperature differential between the cold or hot fluid source 40 or 20 and the workpiece temperature include heat losses (or gains) along the return lines 24, 44 and supply lines 22, 42, as well as other losses to the environment within the reactor.

In operation, during a high temperature processing step (or "hot phase"), fluid from the hot fluid source 20 is preferably circulated through the hot supply line 22, the first or supply-end three-way switching valve 26, the common supply line section 50, the fluid channels 15, the common return line section 52, the second or return-end three-way switching valve 28, the hot return line 24 and back to the hot fluid source 20. When the high temperature processing is completed, the switch is activated to bring the heat source in thermal communication with the chuck. Namely, the supply-end three-way switching valve 26 along the hot supply line 22 is closed, and the purge valve 35 to the purge line 30 is opened. Purge gas, such as nitrogen gas (N₂) in the illustrated embodiment, then flows under pressure through the fluid channels 15 in the wafer chuck 10, thereby blowing residual hot fluid out through the hot return line 24 back into the hot fluid source 20. Alternatively, the return-end three-way switching valve 28 at the juncture of the return lines 24, 44 can be switched to allow purged heat transfer fluid to the cold fluid source 40. In the latter arrangement, the volume of fluid in the cold fluid source 40 is preferably large enough that the purged hot fluid has little effect on the overall temperature of the cold fluid source 40.

Once the wafer chuck 10 has been purged of hot fluid, the purge valve 35 is switched off and the supply-end switching valve 26 at the juncture of the supply lines 22, 42 is switched to allow flow from the cold fluid source 40 through the wafer chuck 10. At the same time, the switching valve between the return lines 40a and 40b is switched to allow flow of cold fluid back to the cold fluid source 20 from the wafer chuck 50. After the cold phase is complete (e.g., the workpiece has cooled sufficiently to allow storage in a low temperature storage cassette, or a low temperature process is completed), the supply-end three-way switching valve 26 is again switched to an off position, while the purge valve 35 is opened to once again purge fluid from the wafer chuck 10. As with purging after a high temperature cycle, the cold fluid can be purged to the hot fluid source 20, but is preferably purged to its originating cold fluid source 40. The cycle is then repeated by switching the valves 26, 28 again to allow flow from the hot fluid source 20.

In other arrangements, the purge line 30 can be eliminated from the system of FIG. 1, particularly if the hot fluid source 20 and the cold fluid source 40 comprise the same heat transfer fluid. In such an arrangement, hot heat transfer fluid can be purged with cold heat transfer fluid, without the intermediate gas purge step. As noted, the mass of the hot fluid source 20 is desirably high enough that mixing of purged cold fluid has negligible effect on the temperature of the stored hot fluid. Similarly, the mass of the cold fluid source 40 is desirably high enough that mixing of purged hot fluid with the cold fluid source 40 has negligible effect on the temperature of the stored cold fluid. Preferably, the volume of fluid in each of the hot fluid source 20 and the cold fluid source 40 is greater than about five (5) times the volume of the purged fluid (representing a volume of fluid within the supply lines 22, 42 and return lines 24, 44 and within the fluid channels 15 in the wafer chuck 10). More preferably, the fluid sources 20, 40 are each greater than about ten (10) times and most preferably greater than about twenty (20) times the volume of purged fluid.

Figure 2:
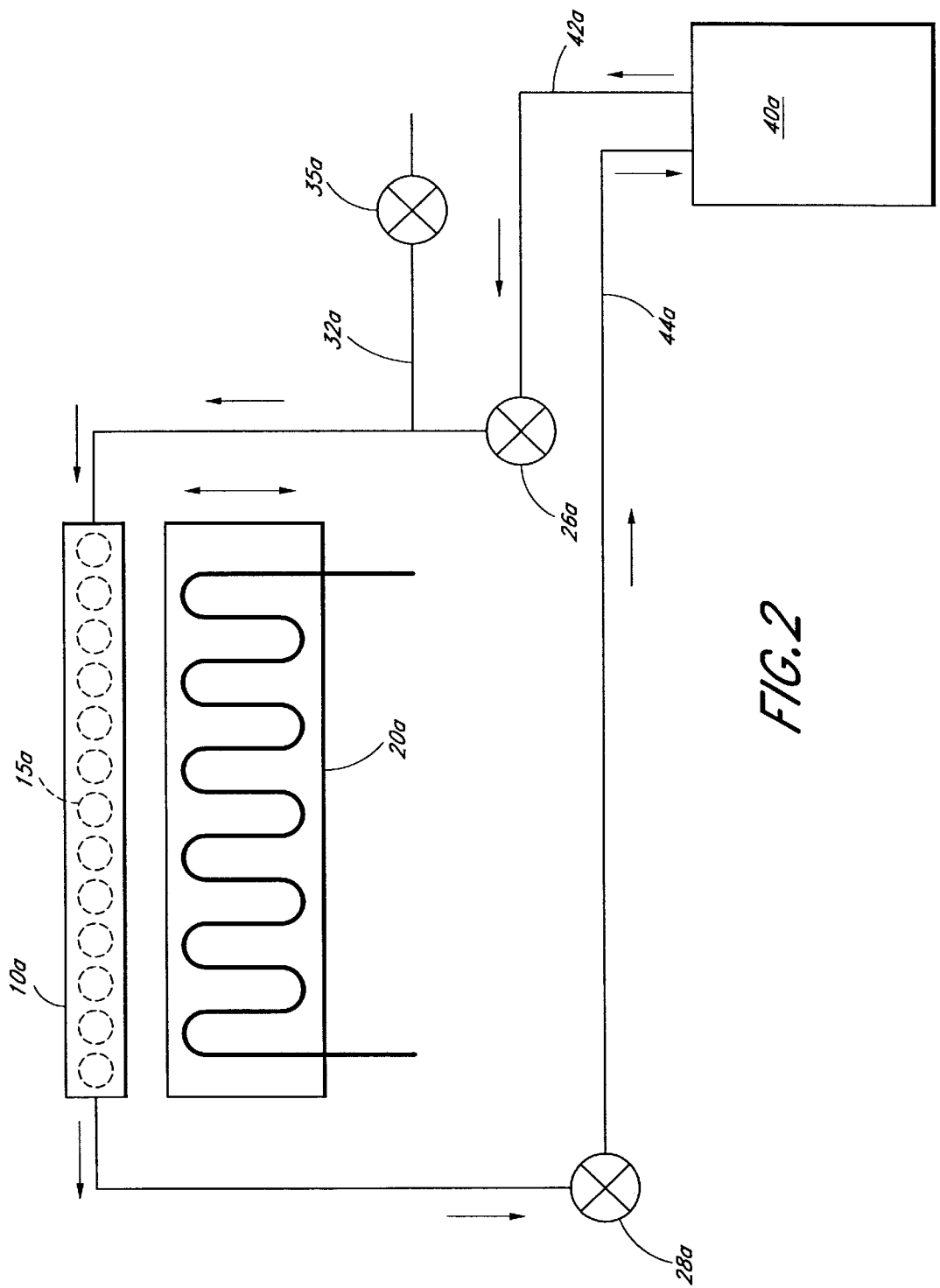
FIG. 2 is a schematic view of a dual temperature workpiece chuck having a cold fluid source and a movable heater block, constructed in accordance with a second preferred embodiment of the present invention.

Referring now to FIG. 2, the workpiece support of the second embodiment also comprises a wafer chuck 10a including fluid channels 15a. In the figures, parts that correspond to parts of the previous embodiment are referenced by like numerals with the addition of a suffix "a". As in the previously described embodiment, a cold fluid source 40a, storing thermal transfer fluid at a relatively low temperature, circulates cold heat transfer fluid through the fluid channels 15a in the wafer chuck 10a via a supply line 42a and a return line 44a. The cold fluid source 40a can be as described with respect to the previous embodiment. The second embodiment also includes a purge line 32a in communication with the supply line 42a via an on/off purge valve 35a.

In place of the hot fluid source 20 (FIG. 1) of the previous embodiment, however, the heat source of the second embodiment is a movable electrically heated chuck or heater block 20a, as illustrated in FIG. 2. Preferably, the heater block 20a is movable relative to the wafer chuck 10a, although it will be understood that, in some arrangements, the wafer chuck 10a can be made movable while the heater block 20a remains stationary. A switch for selectively bringing the heat source into thermal communication with the chuck thus comprises an actuator (not shown) that activates the motor for moving the heater block 20a. It will be understood, of course, that the chuck could be moved while the heater block is stationary.

The heater block 20a is preferably maintained during processing at a hot or process temperature that is equal to or slightly above the desired workpiece temperature for a high temperature integrated circuit fabrication process, much in the way that the heat transfer fluid within the hot fluid source 20 of FIG. 1 is constantly maintained at the desired high temperature. The heater block 20a can be maintained at a desired high temperature by any of a variety of suitable means. For example, the heater block 20a can be heated by fluid convection, where heat transfer fluid heated in a hot fluid source is circulated through the heater block 20a, much in the way that the wafer chuck 10 is directly heated by fluid convection in the embodiment of FIG. 1. In the illustrated embodiment, the heater block 20a is maintained at a high temperature by electrical or resistive heating. In still other arrangements, the heater block 20a can be radiantly heated, inductively heated, etc.

Advantageously, the heater block 20a has a high thermal mass relative to the supporting portion of the wafer chuck 10a. Preferably, the thermal mass of the heater block 20a is greater than that of the wafer chuck 10a, more preferably greater than about 5 times and most preferably greater than about 10 times the thermal mass of the wafer chuck 10a.

In operation, when a wafer or other workpiece supported upon the chuck 10a is ready for high temperature processing, the heater block 20a is positioned for conductive heat transfer between the heater block 20a and the chuck 10a. Preferably, the heater block 20a directly contacts the chuck 10a, more preferably flush across major surfaces of the heater block 20a and the backside of the chuck 10a.

When it is desired to cool the wafer to a cold or lower temperature, the heater block 20a is removed from the thermally conductive position. In the illustrated embodiment, the heater block 20a is lowered from the chuck 10a, preferably by a distance of at least about 0.25 inch, and more preferably by a distance of about 0.5 inch. At the same time, or slightly after removal of the heater block 20a, the valves 26a, 28a on the supply and return lines 42a, 44a to the cold fluid source 40a are opened, and cold fluid is circulated through the lines and the wafer chuck 10a. The chuck 10a is thereby quickly cooled to approximately the temperature of the cold fluid source 40a. It will also be understood that the lower the thermal mass of the chuck 10a, particularly in relation to the heater block 20a, the quicker the chuck temperature can be changed.

In some arrangements, a lower temperature process phase is conducted on the workpiece seated on the chuck 10a. In other arrangements, the cooled workpiece can be removed from the chuck 10a at this stage and placed in a low-cost storage cassette without waiting for further cooling, and without the need for separate workpiece cooling mechanisms (such as cooling stations utilized in many semiconductor processing systems).

When it is desirable to once again heat the wafer chuck 10a, the valve 26a on the supply line 42a from the cold fluid source 40a is closed, and the valve 35a on the purge line 32a is opened to allow gas flow through the fluid channels 15a in the wafer chuck 10a. Residual cold fluid is thereby purged from the channels 15a in wafer chuck 10a through the return line 44a and back to the cold fluid source 40a. At the same time, or slightly after shutting the cold fluid flow, the heater block 20a is moved relative to the chuck 10a to bring the heater block 20a again in a position where heat is conductively exchanged from the heater block 20a to the wafer chuck 10a.

Preferred Processes Employing the Illustrated Dual Temperature Chucks

Preferably, the illustrated dual temperature wafer chucks 10, 10a are employed within a microwave plasma asher for stripping organic photoresist from integrated circuit workpieces. In addition to a remote microwave plasma source, which produces oxygen and/or fluorine radicals upstream of the process chamber, the reactor can also employ an internal radio frequency (RF) plasma generator within the process chamber. In the latter case, the wafer chuck 10, 10a is powered, as well as a portion of the chamber walls, producing a parallel plate arrangement suitable for reactive ion etching within the chamber.

As previously noted, the dual temperature wafer chucks 10, 10a of the preferred embodiments are particularly useful for photoresist stripping and/or cleaning operations within a microwave plasma ashing reactor, also known as a chemical downstream etch (CDE) reactor. Photoresist is applied and removed from a workpiece at various stages of semiconductor fabrication. As set forth in more detail below, the illustrated dual temperature wafer chucks 10, 10a have utility in many resist strip contexts.

Post-Implant Resist Strip

During initial stages of semiconductor fabrication, regions of a semiconductor substrate are implanted with dopants (e.g. boron, phosphorous, arsenic) through a photoresist mask. Ion implantation is similarly performed through masks in many other doping steps. The ion implantation process results in a hardened crust at the top surface of the photoresist. Outgassing during high temperature steps tends to be trapped by the hardened crust until an explosive pressure is built within the photoresist, potentially causing damage to both the partially fabricated wafer as well as the reactor. Traditionally, utilizing a low temperature strip process to avoid excess gas build-up has minimized this risk.

In a preferred process employing the dual temperature wafer chucks 10, 10a of the illustrated embodiments, an initial strip is first conducted at low temperature until the trapping crust is removed from the photoresist. Wafer temperatures during the initial step are preferably kept between about 100° C. and 140° C., more preferably between about 110° C. and 125° C. Reaction gases can include an oxidant to aid oxidation of the resist (e.g., $O_2$, preferably converted to oxygen radicals); a fluorine source to aid removal of the implanted portion (e.g., $NF_3$ or $CF_4$, preferably converted to fluorine radicals); and a diluting gas (such as He or Ar) and/or forming gas ($H_2/N_2$) to serve as a carrier. Reactants can be supplied to the workpiece surface in any suitable fashion. Radicals are preferably generated in a remote microwave plasma generator. The implanted upper portion of the resist is typically removed in about thirty (30) seconds.

During this low temperature step, cold fluid is preferably circulated through the wafer chuck 10, 10a, and the cold fluid is desirably stored in the cold fluid source 40, 4a at the desired wafer temperatures (i.e., between about 100° C. and 140° C., more preferably between about 110° C. and 125° C.). Accordingly, the "cold" fluid is actually heated to the desired temperature.

Once the crust has been removed, reaction continues while the temperature of the chuck 10, 10a is raised. With the embodiment of FIG. 1, for example, the cold fluid is purged from the wafer chuck 10, preferably with a purge gas for about five (5) seconds, and the hot fluid is circulated through the wafer chuck 10. Utilizing the chuck 10a of FIG. 2, switching temperatures involves stopping the cold fluid flow through the heater chuck 10a, purging the cold fluid from the chuck 10a, and raising the heater block 20a to conductive contact with the wafer chuck 10a.

Preferably, the temperature is raised to between about 150° C. and 300° C. and more preferably between about 200° C. and 250° C. The same reactant chemistry can continue to flow during the second stage of the strip. Preferably, however, $N_2$ (or forming gas) flows with $O_2$ and fluorine flow can be optionally discontinued. The raised temperature results in a significantly increased etch rate, thereby improving workpiece throughput. In particular, a temperature of about 250° C. results in a strip rate of about 7 $\mu$m/min. A typical photoresist mask of about 1 $\mu$m can therefore be removed within about 5 to 10 seconds.

Post-Via Resist Strip

At various stages during semiconductor fabrication, vias are created through layers, typically through insulating layers such as borophosphosilicate glass (BPSG) or oxides formed from tetraethylorthosilicate (TEOS). A photoresist mask is selectively exposed and developed in a desired pattern and the developed or undeveloped resist is removed, depending upon whether positive or negative resist is employed. Vias are then formed through the patterned photoresist mask and through the exposed portions of the underlying layer, typically an oxide.

After via formation, the photoresist mask must be removed. Unfortunately, the process of forming the via creates an organic residue within the via, which is often difficult to remove. The residue is often referred to in the industry as a polymer "veil," and is particularly problematic following reactive ion etching of vias for back-end or metallization stages of fabrication. While relatively vigorous cleaning chemistries must be employed to remove this polymer residue, overetching risks damage to the exposed features within the via. Accordingly, it is advantageous to conduct the post-via formation cleaning, after rapid resist stripping, at relatively low temperatures.

With the wafer chuck 10, 10a at an elevated temperature (e.g., 200° C. to 250° C.), a high temperature resist strip can be conducted at rapid rates, as disclosed above with respect to the second stage of the post-implant process. Reactants can also be as discussed above, with optional fluorine flow. During this high temperature step, hot fluid can circulate through the wafer chuck 10 (FIG. 1) or a heater block 20a can be positioned for conductive thermal exchange with the wafer chuck 10a (FIG. 2).

In the illustrated embodiment, wherein the wafer chuck 10, 10a can be quickly adjusted between two temperatures, the post-via cleaning can be conducted within the same process chamber as the resist strip. Accordingly, a low temperature cleaning process is conducted immediately following the resist strip process. Thus, for reactors employing the apparatus of FIG. 1, hot fluid circulation is discontinued and purged from the fluid channels 15, and subsequently replaced with cold heat transfer fluid. If the apparatus of FIG. 2 is employed, the heater block 20a is removed from the wafer chuck 10a and cold fluid begins to circulate through the wafer chuck 10a.

During the post-strip clean process, the workpiece temperature is preferably kept between about room temperature and 100° C., more preferably between about 50° C. and 80° C. The chemistry during this process preferably includes an oxidant (e.g., $O_2$), a diluting gas (e.g., He, Ar, and/or forming gas—$N_2/H_2$), and a fluorine source gas (e.g., $NF_3$ or $CF_4$). The fluorine, while aiding removal of the polymer, also attacks the oxide sidewalls of the via. Preferably, the oxidant and fluorine reactants comprise radicals formed upstream of the reaction chamber.

The process preferably includes RF plasma generation within the chamber, compensating for reduced temperatures during the process. $N_2$ or forming gas aid maintenance of the plasma discharge. Additionally, an optional physical sputter etch can be briefly applied immediately after treatment with the oxygen and fluorine sources.

During the post-via clean, "cold" fluid is thus circulated through the wafer chuck 10, 10a, where the cold fluid source is kept within the desired workpiece temperature range. Upon completion of the via cleaning step, the workpiece is removed from the chamber, cold fluid circulation is discontinued and the cold fluid is purged from the fluid channels 15, 15a. In the embodiment of FIG. 1, the cold fluid is replaced with hot heat transfer fluid, while in the embodiment of FIG. 2, the heater block 20a is positioned for thermally conductive exchange with the wafer chuck 10a. The chuck 10 or 10a is thus prepared for processing another wafer.

Reduction of Oxide Loss

As discussed above with respect to the post-via stripping, residues in vias formed by RIE during back-end metallization are cleaned after the photoresist stripping. More generally, however, contact openings or holes are formed at many stages of integrated circuit fabrication, whether by wet etch, dry vapor etch or RIE.

Integrated circuits include many dielectric elements for electrical isolation of conductive elements. A common material for such dielectric elements is silicon oxide in various forms, although silicon nitride is also popular for many applications.

In forming electrical contacts among conductive elements, the contact holes or openings are formed through insulating layers known as interlevel dielectrics (ILDs). Opening contact holes to active areas within semiconductor substrates often expose insulative sidewall spacers over transistor gate electrodes. Such contact etches typically also expose sacrificial oxide over the substrate. In each of these examples, masks are employed to define the hole or via, and an etch process exposes oxide surfaces.

Such oxide surfaces define dimensions selected by a circuit design. As device packing density continues to increase in pursuit of faster integrated circuit (IC) operating speeds and lower power consumption, it becomes ever more critical to maintain these dimensions, and tolerance for overetch is commensurately reduced. Cleaning the openings after removal of the photoresist mask, therefore, needs to be carefully controlled to avoid overetch of the exposed insulating surfaces, particularly oxide surfaces.

Accordingly, a first stage of post-contact etch resist stripping is conducted at high temperatures (preferably between about 100° C. and 300° C., more preferably between about 200° C. and 250° C.), with the wafer supported upon a dual temperature wafer chuck 10 or 10a (FIGS. 1, 2). An exemplary reactant flow includes 1:10 ratios of $N_2:O_2$.

After the strip, the illustrated dual temperature wafer chucks 10, 10a can be employed to perform a lower temperature post-strip clean. As noted with respect to the post-via cleaning, fluorine aids in cleaning oxide surfaces of lithography by-products. Desirably, a relative small percentage of fluorine gas source (e.g., less than about 5% $CF_4$) is added to the flow.

Advantageously, employment of an RF plasma, in addition to the remote plasma generator, lowers the required process temperature for a given etch rate. Accordingly, the cold fluid source 40, 40a is preferably maintained between about 15° C. and 100° C., more preferably between about 20° C. and 100° C., and most preferably between about 25° C. and 50° C. Despite rapid etch rates, the post-strip clean can be strictly controlled by limiting the time for which the RF electrodes are powered (e.g. for about 15 seconds).

Post-Process Cooling

In addition to the two stage processes discussed above, the disclosed dual temperature wafer chucks 10 or 10a (FIGS. 1, 2) can advantageously increase workpiece throughput for any desired process, including single-temperature processes which are conducted at high temperatures.

For such processes, a rapid resist strip process (preferably between about 100° C. and 300° C., more preferably between about 200° C. and 250° C.) can be followed by lowering the wafer temperature, while still mounted upon the chuck 10, 10a, to levels tolerable by commercial storage cassettes. Preferably, the wafer temperature is lowered to less than about 100° C., and more preferably to less than about 70° C.

Since, for this step, no workpiece treatment is to be conducted, the workpiece temperature need not be stabilized prior to removal. Accordingly, the cold fluid source 40, 40a can be maintained at well below the desired removal temperature. A high temperature differential between the hot wafer chuck 10 or 10a (after resist strip) and the cold fluid introduced to the fluid channels 15, 15a results in very rapid cooling of the workpiece/chuck combination. Accordingly, the cold fluid source 40, 40a is preferably maintained below about 100° C., and more preferably below about 70° C. The workpiece can thus be removed from the chuck 10, 10a and placed directly into a low temperature storage cassette without any waiting beyond the time required to open the chamber gate valve and extend the transfer robot to lift the workpiece.

Accordingly, several objects and advantages inhere in the described invention. For example, processes that require two-step processing at different temperatures can be efficiently conducted within the same process chamber. Also, the heat transfer fluid used for both the hot and cold fluid sources can be the same, which minimizes any cross-contamination and reaction between fluids. Furthermore, workpiece throughput can be increased by eliminating a separate cooling station conventionally used for cooling workpieces prior to placement in low-cost storage cassette.

It will be appreciated by those skilled in the art that various modifications and changes may be made without departing from the scope of the invention, and all such modifications and changes are intended to fall within the scope of the invention, as defined by the appended claims.

I claim:

1. A method of controlling a workpiece chuck temperature in a process chamber, comprising:

circulating a first heat transfer fluid through the chuck during a cold phase to bring the chuck to a first temperature;

removing the first heat transfer fluid from the chuck during a hot phase; and heating the chuck to a second temperature higher than the first temperature during the hot phase.

2. The method of claim 1, wherein removing the heat transfer fluid comprises purging the first heat transfer fluid from the chuck with a purge gas.

3. The method of claim 1, wherein heating comprises circulating a second heat transfer fluid through the chuck.

4. The method of claim 3, wherein removing the first heat transfer fluid comprises directly replacing the first heat transfer fluid with the second heat transfer fluid.

5. The method of claim 3, wherein removing the first heat transfer fluid comprises purging the first heat transfer fluid from the chuck with purge gas prior to circulating the second heat transfer fluid.

6. The method of claim 1, wherein heating comprises moving a heater block into thermally conductive contact with the chuck.

7. The method of claim 1, comprising removing photoresist from a workpiece that supported upon the chuck during the hot and cold phases, wherein the first temperature is less than about 150° C., and the second temperature is between about 150° C. and 300° C.

8. The method of claim 1, wherein the cold phase comprises removing an ion implanted photoresist crust from a workpiece supported on the chuck at the first temperature, and the hot phase comprises removing an underlying photoresist from the workpiece at the second temperature.

9. The method of claim 8, wherein the first temperature is between about 110° C. and 125° C., and the second temperature is between about 200° C. and 250° C.

10. The method of claim 1, wherein the hot phase comprises removing a photoresist layer from over a workpiece supported on the chuck at the second temperature, and the cold phase comprises cleaning a polymer residue from the workpiece at the first temperature after the hot phase.

11. The method of claim 10, wherein the first temperature is between about room temperature and 100° C. and the second temperature is between about 150° C. and 300°.

12. The method of claim 10, wherein the hot phase comprises flowing an oxidant without fluorine and the cold phase comprises flowing an oxidant with fluorine.

13. The method of claim 1, wherein the hot phase comprises removing a photoresist from over a semiconductor substrate supported upon the chuck, and the cold phase comprises removing an oxide from over the substrate after the hot phase.

14. The method of claim 13, wherein the first temperature is between about 20° C. and 100° C. and the second temperature is between about 100° C. and 300°.

15. The method of claim 14, wherein the first temperature is between about 25° C. and 50° C. and the second temperature is between about 200° C. and 250°.

16. The method of claim 1, wherein the hot phase comprises removing a photoresist layer from over a workpiece supported on the chuck at the first temperature, and the cold phase comprises cooling the workpiece after the hot phase for removal from the process chamber.

17. The method of claim 16, wherein the first temperature comprises less than about 70° C.

* * * * *